United States Patent [19]

Yum

[11] Patent Number: 4,506,173

[45] Date of Patent: Mar. 19, 1985

[54] LOW POWER PARTITIONED PLA

[75] Inventor: Daniel Yum, Poway, Calif.

[73] Assignee: Burroughs Corporation, Detroit, Mich.

[21] Appl. No.: 436,374

[22] Filed: Oct. 25, 1982

[51] Int. Cl.³ .............. H03K 19/177; H03K 19/013; H03K 19/086

[52] U.S. Cl. .................. 307/466; 307/467; 307/443; 364/716

[58] Field of Search .............. 307/443, 242, 465–467; 364/716; 365/72, 96, 103–105

[56] References Cited

U.S. PATENT DOCUMENTS

| | | | |
|---|---|---|---|
| 3,818,252 | 6/1974 | Chiba et al. | 307/466 X |
| 4,385,370 | 5/1983 | Isogai | 307/467 X |
| 4,433,331 | 2/1984 | Kollaritsch | 307/465 X |

OTHER PUBLICATIONS

Askin et al., "PLA with Segmented Lines for Faster Signal Propagation", IBM Tech. Disc. Bull., vol. 24, No. 7B, Dec., 1981, p. 3898.
Greenspan, "Multiple Partitioned Programmable Logic Array", IBM Tech. Disc. Bull., vol. 19, No. 5, Oct., 1976, pp. 1780–1781.
Whitley, "PLA Having OR-Array Bit Partitioning", IBM Tech. Disc. Bull., vol. 24, No. 6, Nov. 1981, pp. 2747–2748.

Primary Examiner—Stanley D. Miller
Assistant Examiner—David R. Hudspeth
Attorney, Agent, or Firm—Charles J. Fassbender; Kevin R. Peterson

[57] ABSTRACT

A logic array includes a plurality of gated current sources which receive respective input signals, each of said gated current sources is coupled to a respective row conductor and sends current to that row conductor when the received input signal is in a predetermined state; the respective row conductors are partitioned into several groups; a respective high capacitance column conductor is provided for each group; within each group, diodes selectively couple current from the row conductors to the respective high capacitance column conductor; a low capacitance column conductor is provided; and a circuit generates current on the low capacitance column conductor representing the logical NAND of selected input signals when current is coupled from any group of row conductors to the high capacitance column conductor for that group.

12 Claims, 15 Drawing Figures

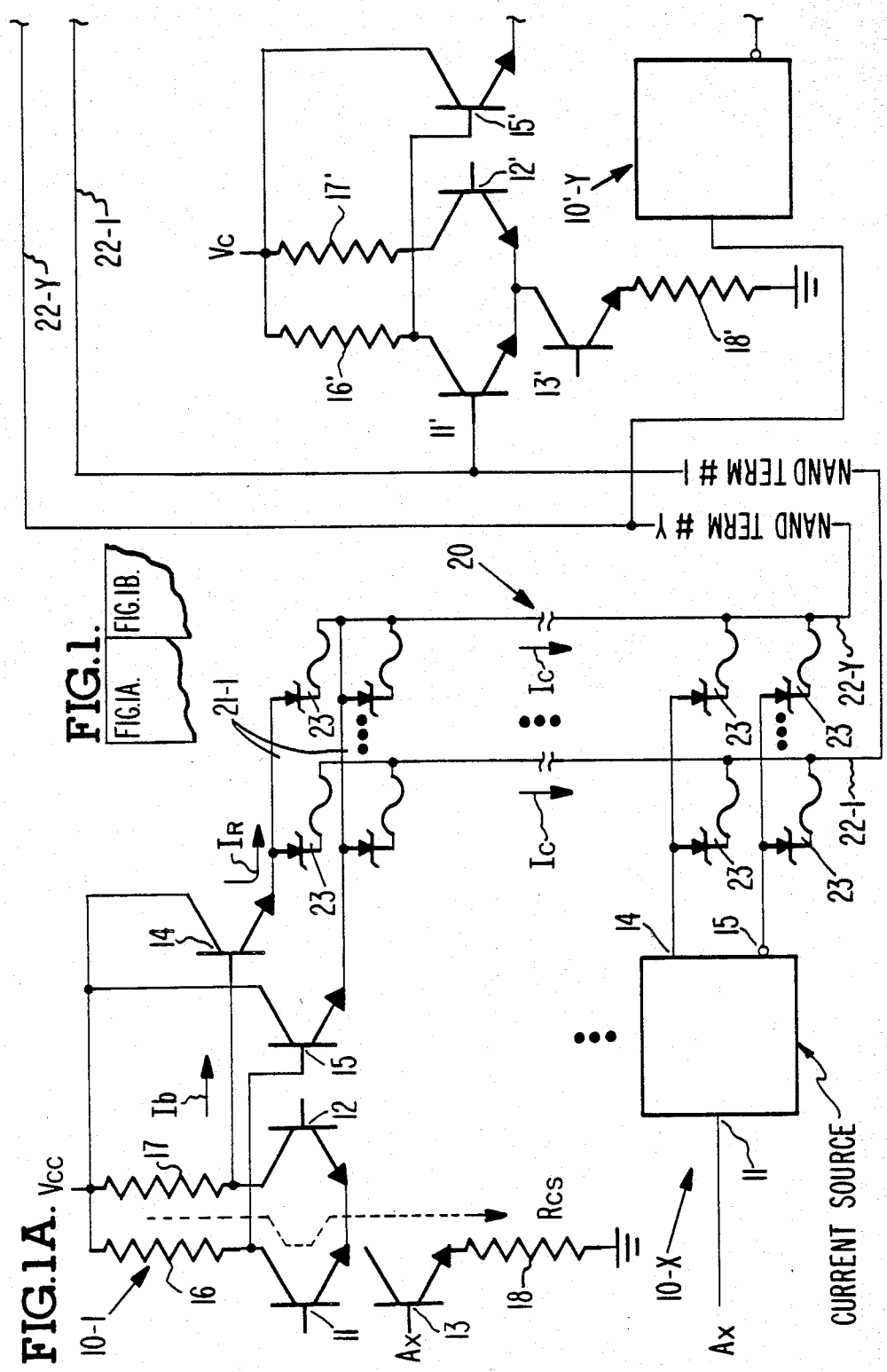

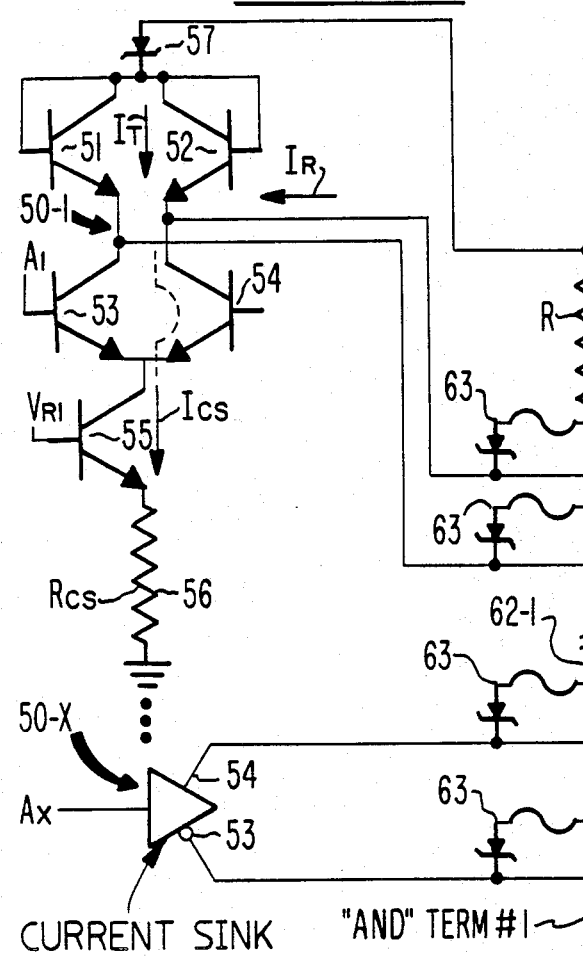
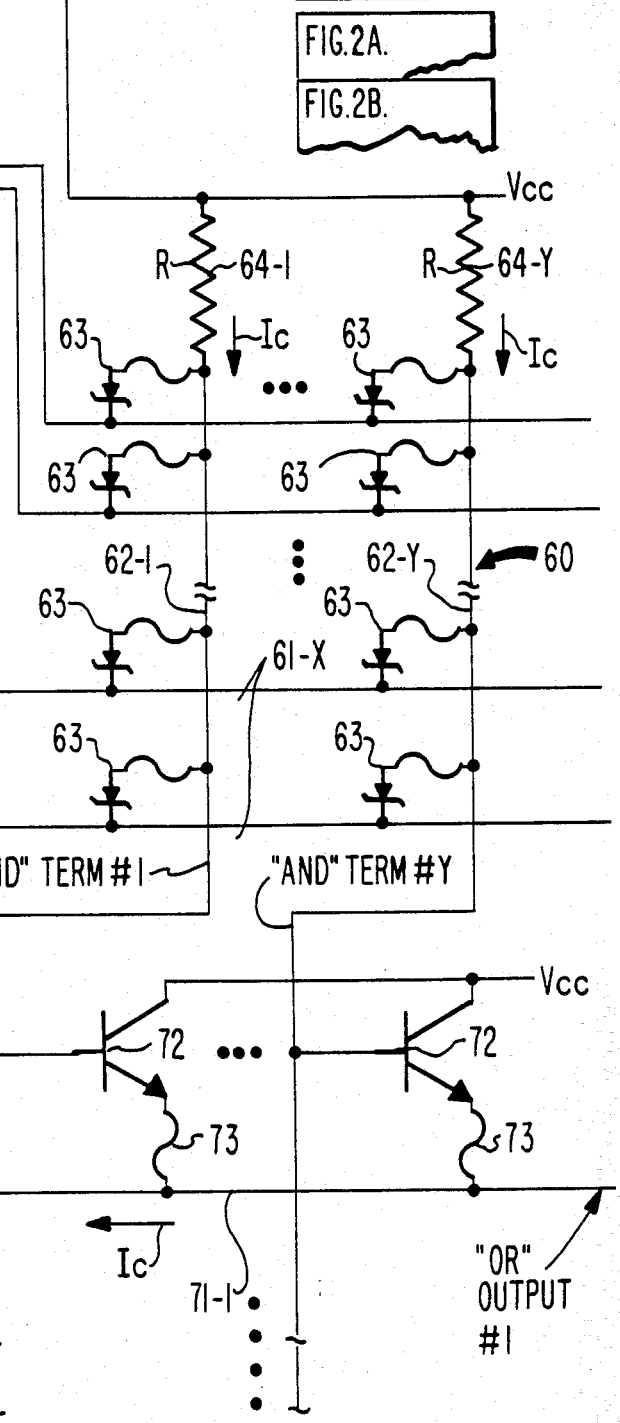
FIG. 2A. Prior Art
FIG. 2. Prior Art

|       | $Z = \frac{X}{2}$ | $Z = X$ | $Z = 2X$ |
|-------|---|---|---|
| $Y = X$  | $X \geq 11$ $\frac{1}{1.477}$ | $X \geq 6$ $\frac{1}{2.105}$ | $X \geq 3$ $\frac{1}{3.045}$ |
| $Y = 2X$ | $X \geq 11$ $\frac{1}{1.560}$ | $X \geq 6$ $\frac{1}{2.297}$ | $X \geq 3$ $\frac{1}{3.392}$ |
| $Y = 3X$ | $X \geq 12$ $\frac{1}{1.595}$ | $X \geq 6$ $\frac{1}{2.379}$ | $X \geq 3$ $\frac{1}{3.536}$ |

FIG. 3A.
FIG. 3.
COLUMN 1 (FIG. 1. ANALYSIS)

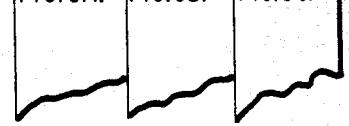

eg. 1. $I_R = I_c Y$ eg. 2. $I_b = \dfrac{I_c Y}{\beta}$ eg. 3. $I_{cs} > I_b$ TO INSURE $I_{cs} R_b$ TURN OFF eg. 4. eg: $I_{cs} = \dfrac{5 I_c Y}{\beta}$ eg. 5. $Y = 50, \beta = 50, \therefore I_{cs} = 5 I_c$ eg. 6. $\therefore R_{cs} \cong \dfrac{R}{5}$ eg. 7. $\therefore$ DOES NOT VARY FROM $\dfrac{\hat{R}_{cs}}{\hat{R}}$ eg. 8. $R_{cs}$ CAN BE MADE NEARLY IDENTICAL TO R VIA CIRCUIT 40 eg. 9. $\therefore$ FROM egs. 4 AND 7, le AND $\hat{I}_{cs} = \dfrac{5 \hat{I}_c Y}{\beta}$ eg. 10. THEN EVEN IF $I_c = 1.2 \hat{I}_c$ WHEN $I_{cs} = \hat{I}_{cs}$, eg. 3 STILL MED eg. 11. $\hat{p}_I = \dfrac{5 \hat{I}_c Y}{\beta} (V_{cc})(X) \cong \dfrac{5 \hat{I}_c Y}{10} (V_{cc})(X)$

FIG. 3B.

COLUMN 2 (FIG. 2. ANALYSIS)

eg.1.  $I_{cs} = I_c Y + I_T$ eg.2.  $Y \geq 50$ eg.3.  $\therefore I_{cs} \gg I_c$ eg.4.  $\therefore R_{cs} \ll R$ eg.5.  $\therefore \dfrac{R_{cs}}{R}$ CAN VARY FROM $\dfrac{\hat{R}_{cs}}{\hat{R}}$ BY $\pm 20\%$ eg.6.  $R_{cs} = \hat{R}_{cs}$ WHEN $R = 0.8 \hat{R}$ eg.7.  $\therefore I_{cs} = \hat{I}_{cs}$ WHEN $I_c = 1.2 \hat{I}_c$ eg.8.  $\therefore I_{cs} = \hat{I}_{cs}$ WHEN $I_R = 1.2 \hat{I}_c Y$ eg.9.  $I_T \cong 0.1 I_{cs}$ WHEN $\hat{I}_R = $ MAX eg.10.  $\therefore \hat{I}_{cs} \geq 1.2 \hat{I}_c Y + 0.1 \hat{I}_{cs} \cong 1.3 \hat{I}_c Y$ eg.11.  ALLOW 10% MARGIN eg.12.  SET $\hat{I}_{cs} = 1.4 \hat{I}_c Y$ eg.13.  $\hat{p}_2 = (1.4 \hat{I}_c Y)(V_{cc})(X)$

FIG.3C.

COLUMN 3 (FIG.1.AND 2. COMPARISON)

eg.1. $\hat{p}-\text{RATIO} = \dfrac{\frac{5}{\beta}}{1.4} \cong \dfrac{1}{14}$ eg.2. $\hat{P}_{1T} = \dfrac{\hat{I}_c Y}{10}(V_{cc})(X) + \hat{I}_c V_{cc} Y + \dfrac{\hat{I}_c Z}{10}(V_{cc})(Y) + \hat{I}_c V_{cc} Y$ eg.3. $\hat{P}_{2T} = 1.4 \hat{I}_c Y (V_{cc})(X) + \hat{I}_c V_{cc} Y + \hat{I}_c V_{cc} Z$ eg.4. $\hat{P}_T - \text{RATIO} = \dfrac{\frac{YX}{10} + \frac{ZY}{10}}{1.4 YX} = \dfrac{X+Y}{14X}$ eg.5. if $X=Z$, THEN $\hat{P}_T - \text{RATIO} = \dfrac{1}{7}$

FIG.4.

COLUMN 1 (FIG.1 ANALYSIS)
   eg.1. CURRENT SOURCE T'S = 5X
   eg.2. ARRAY D'S = (2X)(Y)
   eg.3. COLUMN T'S = Y
   eg.4. CURRENT SOURCE T'S = 4Y
   eg.5. ARRAY D'S = (Y)(Z)
   eg.6. COLUMN T'S = Z
   eg.7. $A_1 = [5X+5Y+Z] A_T + [2XY+YZ] A_D$

COLUMN 2 (FIG.2. ANALYSIS)
   eg.1. CURRENT SINK T'S = 5X
   eg.2. CURRENT SINK D'S = X
   eg.3. ARRAY D'S = (2X)(Y)
   eg.4. ARRAY T'S = (Y)(Z)
   eg.5. ROW T'S = Z
   eg.6. $A_2 = [5X+YZ+Z] A_T + [X+2XY] A_D$

COLUMN 3 (FIG.1. AND 2. COMPARISON)
   eg.1. $[5X+YZ+Z] A_T + [X+2XY] A_D$ vs $[5X+5Y+Z]A_T+[2XY+YZ]A_D$
   eg.2. $A_T \simeq 10 A_D$ eg.3. $A\text{-RATIO} = \dfrac{A'}{A} = \dfrac{10X+50Y+10Z+2XY+YZ}{51X+10Z+2XY+10YZ}$ eg.1. $P=k(X)(IcY)=P_0$ eg.1. $q = VC$ eg.2. $I\Delta t$ eg.3. $\therefore \Delta t = \dfrac{CV}{I}$ eg.4. $C = C_0 + C_0$ eg.5. $\therefore I = 2Ic$ eg.6. $\therefore P = k(2X)(2IcY)$ eg.7. $\therefore P = 2^2 P_0$ eg.1. $I = mIc$ eg.2. $P = k(mX)(mIcY)$ eg.3. $P = m^2 P_0$

| FIG. 7A-1. |
| FIG. 7A-2. |
| FIG. 7B. |

FIG.7A-2.

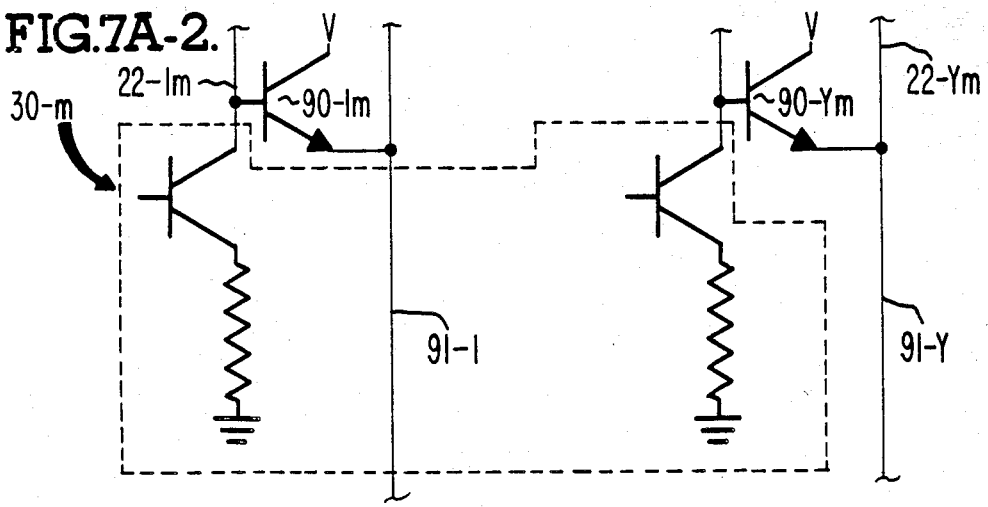

FIG.7B.

eg. 1. $\Delta t = \Delta t_1 + \Delta t_2$ eg. 2. $\Delta t = \dfrac{C_0 V}{I_c} + \dfrac{C'V}{I'}$ eg. 3. $C_0 = C_{floor} + 2C_{sidewall}$ eg. 4. $C_0 \simeq 0.10\, fF/\square + 2 \times 0.40\, fF/\square$ eg. 5. $C' = C_m \simeq 0.025\, fF/\square$ eg. 6. $C\text{-ratio} \simeq \dfrac{30}{1}$ eg. 7. $\therefore$ if $I' = I_c'$ then $\Delta t = \dfrac{C_0 V}{I}$ eg. 8. $P_1 = k(X)(I_c Y) = P_2 = P_3 \ldots = P_0$ eg. 9. $P_T = m P_0$ eg. 10. $P_2 = k(I_c Y)m + kI'Y$ eg. 11. $P\text{-ratio} = \dfrac{mP_0}{m^2 P_0} = \dfrac{1}{m}$

LOW POWER PARTITIONED PLA

BACKGROUND OF THE INVENTION

This invention relates to programmable logic arrays (PLA's); and more particularly, it relates to PLA's which consume a reduced amount of power and occupy a reduced amount of chip space.

In general, a PLA is a logic circuit which receives a plurality of digital input signals and generates a plurality of digital output signals wherein each of the digital output signals is a programmable sum-of-product combination of the input signals. In conventional PLA's, one circuit is provided for generating a plurality of terms which are the logical AND of selected input signals; and another circuit is provided to generate the output signals by selectively ORing the AND terms. A typical PLA may have a total of 30 input signals, generate a total of 60 AND terms from the input signals, and generate a total of 30 output signals by selectively ORing the 60 AND terms.

One article which describes PLA's in greater detail is "Field-PLA's Simplify Logic Designs", *Electronic Design* 18, Sept. 1, 1975, pages 84–90. See also a technical data sheet from Signetics Corporation on their 82S104 and 82S105 PLA chips entitled "Bipolar Field Programmable Logic Sequencer-82S104 (O.C.)/82S105 (T.S.)", dated August, 1980. A detailed circuit diagram of the PLA described in the former is given on page 86 and a detailed circuit diagram of the PLA described in the latter is given at page 6.

These PLA's of the prior art, along with the power that they consume and the chip space that they occupy, are described in greater detail herein in conjunction with FIGS. 2, 3, and 4. And this analysis will show that by comparison, the PLA's of the present invention use substantially less power and occupy substantially less chip space.

Accordingly, a primary object of the invention is to provide an improved programmable logic aray.

Another object of the invention is to provide a programmable logic array which dissipates substantially less power than PLA's of the prior art.

Still another object of the invention is to provide a programmable logic array which occupies substantially less chip space than PLA's of the prior art.

BRIEF SUMMARY OF THE INVENTION

In one embodiment of the invention, the above objects and others are achieved by a logic array that includes a plurality of gated current sources for receiving respective input signals, each of said gated current sources couple to a respective row conductor and send current to that row conductor when the received input signal is in a predetermined state; the respective row conductors are partitioned into several groups; a respective high capacitance column conductor is provided for each group of row conductors; within each group, diodes selectively couple current from the row conductors to the respective high capacitance column conductor; a low capacitance column conductor is provided; and a circuit generates current on the low capacitance column conductor representing a logical NAND of selected input signals when current is coupled from any group of row conductors to the high capacitance column conductor for that group.

BRIEF DESCRIPTION OF THE DRAWINGS

Various features and advantages of the invention are described in the Detailed Description in conjunction with the accompanying drawings wherein:

FIGS. 1A and 1B show a detailed circuit diagram of one preferred embodiment of the invention;

FIGS. 2A and 2B show a detailed circuit diagram of a PLA of the prior art;

FIGS. 3A, 3B, and 3C include equations which analyze the power dissipated in the PLA's of FIGS. 1 and 2;

FIG. 4 includes equations which analyze the chip area occupied by the PLA's of FIGS. 1 and 2;

FIG. 5 contains some specific numerical results based on the FIG. 4 analysis;

FIGS. 7A-1, 7A-2, and 7B show a detailed circuit diagram of another embodiment of the invention and equations which analyze the power dissipated in that embodiment.

DETAILED DESCRIPTION OF THE INVENTION

Figures 1, 7, 7A:
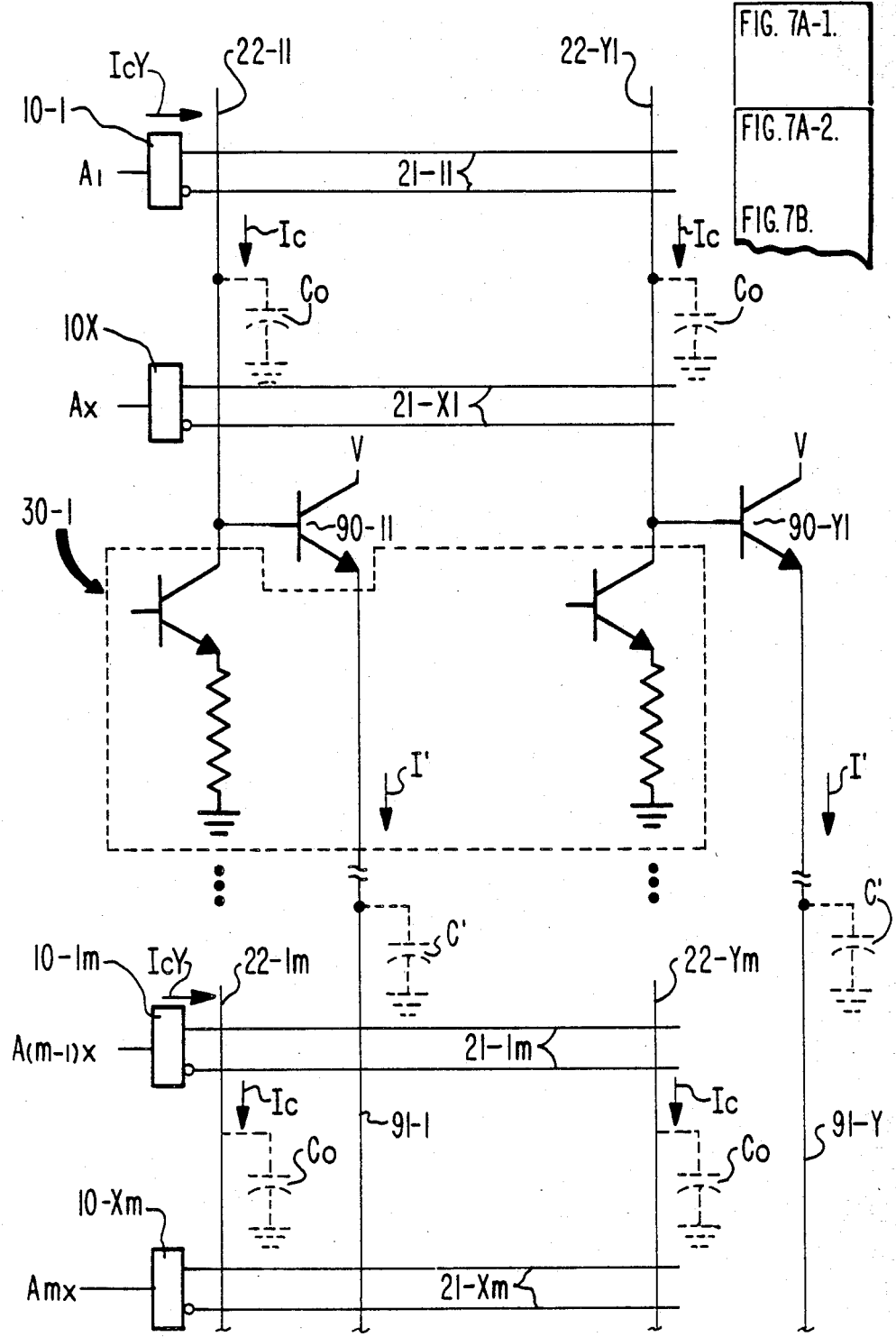

Referring now to FIG. 1, a preferred embodiment of a programmable logic array (PLA) that is constructed according to the invention will be described in detail. Included in this embodiment are "X" gated current sources 10-1 through 10-X, where "X" is any integer. All of the details of current source 10-1 are illustrated in FIG. 1; only a box is shown for current source 10-X since its internal details are the same as current sink 10-1; and a sequence of dots " . . . " indicates the other gated current sources that lie therebetween.

Five transistors 11–15 and three resistors 16–18 are included in current source 10-1. Transistor 11 has a collector connected to resistor 16, which in turn is connected to a voltage source $V_{cc}$. Similarly, transistor 12 has a collector connected to resistor 17 which in turn is connected to voltage source $V_{cc}$. Transistors 11 and 12 also have their emitters connected to the collector of transistor 13; and transistor 13 has an emitter connected to resistor 18 which in turn is connected to ground. An input logic signal $A_1$ is applied to the base of transistor 11; and reference voltages (not shown) are applied to the respective bases of transistors 13 and 12.

When input logic signal $A_1$ is high, transistor 11 turns on so a current $I_{cs}$ flows through transistor 11 while no current flows through transistor 12. Consequently, the voltage on the collector of transistor 11 is relatively low while the voltage at the collector of transistor 12 is relatively high. Conversely, when input signal $A_1$ is low, transistor 11 turns off while transistor 12 turns on so current $I_{cs}$ flows through transistor 12 while no current flows through transistor 11. In that state, the voltage on the collector of transistor 12 is relatively low while the voltage on the collector of transistor 11 is relatively high.

Transistor 14 has a collector connected to voltage $V_{cc}$ and a base connected to the collector of transistor 12. Also, transistor 15 has a collector connected to voltage $V_{cc}$ and a base connected to the collector of transistor 11. Those transistors 14 and 15 turn on when the voltage on their respective bases is relatively high; and they turn off when the voltage on their respective bases is relatively low. Thus, transistor 14 supplies a current from its emitter when input signal $A_1$ is high; while transistor 15 supplies a current from its emitter when input signal $A_1$ is low.

Also included in the FIG. 1 PLA is an array 20 of conductors, diodes, and fuses. A total of "X" row conductor pairs are in the array; and a total of "Y" column conductors are in the array where "Y" is any integer. In FIG. 1, the row conductor pairs are indicated by reference numerals 21-1 through 21-X; while the column conductors are indicated by reference numerals 22-1 through 22-Y.

Each row conductor in a row conductor pair respectively connects to the emitter of one of the transistors 14 and 15. Thus, current flows in one row conductor or the other of a pair depending upon the state of the input logic signal. Then, at each location where a row conductor crosses a column conductor, a serially interconnected diode-fuse 23 is provided to selectively couple current from the row conductors to the column conductors.

Further included in the FIG. 1 embodiment is a circuit 30 which is coupled to conductors 22-1 through 22-Y. Circuit 30 operates to generate respective NAND logic signals indicating when current is received by the various column conductors. Circuit 30 includes a total of Y transistor 31-1 through 31-Y, and a total of Y resistors 32-1 through 32-Y. Each column conductor connects to the collector of a respective transistor; that transmitter's emitter connects to a respective resistor; the base of all of the transistors 31-1 through 31-Y connect to a reference voltage (not shown); and all the resistors connect to ground.

One preferred modification to circuit 30 is indicated by reference numeral 40. There, the Y column conductors are partitioned into several groups of N. For example, fifty column conductors might be partitioned into ten groups of five. Those N column conductors respectively couple to the collector of transistors 41-1 through 41-N. Transistors 41-1 through 41-N then have their emitters all connected together; and they in turn connect to a single resistor 42. Resistor 42 has a resistance which equals that of one of the resistors 32-1 through 32-Y divided by N. Consequently, by choosing an appropriate value for N, the resistance of resistor 42 is made nearly identical to the resistance of resistor 18 in the gated current sources.

All of the above-described circuitry operates to form respective NAND logic signals on column conductors 22-1 through 22-Y. Suppose, for example, that the voltage on column conductors 22-1 is to represent the logical NAND of input signals $A_1$ and $\overline{A_x}$. For that to occur, the voltage on column conductor 22-1 must be low whenever input signal $A_1$ is high and input signal $A_x$ is simultaneously low. Conversely, the voltage on column conductor 22-1 must be high whenever input signal $A_1$ is low or input signal $A_x$ is high.

When signal $A_1$ is low, current will flow from transistor 15 in current source 10-1; while when signal $A_x$ is high, current will flow from transistor 14 in current source 10-X. Thus, the fuse that couples column conductor 22-1 to transistor 15 in current source 10-1 should not be blown; the fuse that couples column conductor 22-1 to transistor 14 in current source 10-X should not be blown; and all other fuses that couple column 22-1 to the other row conductor should be blown.

All of the circuitry that remains to be described in FIG. 1 is similar to that which was described above. In general, that remaining circuit includes another plurality of gated current sources 10'-1 through 10'-Y which are similar to gated current sources 10-1 through 10-X, an array 20' which is similar to array 20, and an output circuit 30' which is similar to circuits 30 and 40.

Each of the gated current sources 10'-1 through 10'-Y includes four transistors 11', 12', 13', and 15'; and three resistors 16', 17', and 18'. With this notation, the transistors and resistors in gated current source 10'-1 have the same number, except for the "prime", as their counterpart in the previously described gated current source 10-1. For example, transistor 15' corresponds to transistor 15.

Similarly, each of the row conductors, column conductors, and diode-fuse combinations in array 20' has the same number except for a "prime" as the number of its counterpart in array 20. That is, row conductors in array 20' are indicated by reference numerals 21'-1 through 21'-Y; the column conductors are indicated by reference numerals 22'-1 through 22'-Z where "Z" is any integer; and diode-fuse combinations are indicated by reference numeral 23'. In like manner, each of the components in output circuit 30' has the same reference numeral except for the "prime" as its counterpart in circuit 30. For example, the transistor and resistor pair that couple to column 22'-1 to form an output signal are labeled 31'-1 and 32'-1.

In the FIG. 1 circuit, transistors 11' in the gated current sources 10'-1 through 10'-Y respectively couple via their base to column conductors 22-1 through 22-Y to receive respective NAND terms therefrom. So, a low on any one of the column conductors 22-1 through 22-Y will cause current to flow in the corresponding row conductors 21'-1 through 21'-Y; and the output voltage on column conductor 22'-1 goes high when current is coupled thereto from any one of the row conductors 21'-1 through 21'-Y.

Thus, the above components with primed reference numerals operate to form output signals which are the logical NAND of selected NAND terms on column conductors 22-1 through 22-Y. Suppose, for example, that the output signal on column conductor 22'-1 is to represent the NAND of the terms on column conductors 22-1 and 22-Y. That is achieved by not blowing the fuses that couple column conductor 22'-1 to row conductors 21'-1 and 21'-Y, while at the same time blowing the fuses that couple column conductor 22'-1 to all the remaining row conductors.

One feature of the FIG. 1 PLA is that it uses substantially less power than PLA's of the prior art. Also, another feature of the FIG. 1 PLA is that it occupies substantially less chip space than PLA's of the prior art. To understand how that is so, reference should now be made to the prior art PLA of FIG. 2.

Included in the FIG. 2 PLA are "X" gated current sinks 50-1 through 50-X. Each gated current sink includes five transistors 51-55, a single resistor 56, and a diode 57. Transistors 51 and 52 have their bases and collectors connected to the cathode of diode 57 which in turn has its anode connected to a voltage supply $V_{cc}$. Transistor 51 has its emitter connected to the collector of transistor 53; and transistor 52 has its emitter connected to the collector of transistor 54. Transistors 53 and 54 have their emitters connected to the collector of transistor 55 which in turn has its emitter connected to resistor 56 which then connects to ground.

In operation, the base of transistor 53 in each of the gated current sinks 50-1 through 50-X is coupled to receive a respective input logic signal $A_1$ through $A_x$; and the base of transistor 54 is coupled to a reference voltage (not shown). When input signal $A_1$ is low, transistor 53 turns off, transistor 54 turns on, and so a current $I_{cs}$ flows through transistor 54. Conversely, when input signal $A_1$ is high, transistor 53 turns on, transistor 54 turns off, and so current $I_{cs}$ flows through transistor 53.

Also included in the PLA of FIG. 2 is an array 60 of row conductor pairs, column conductors, and diode-fuse interconnections. Reference numerals 61-1 through 61-X indicate the row conductor pairs; reference numerals 62-1 through 62-Y indicate the column conductors; and reference numeral 63 indicates the diode-fuse interconnections. Pullup resistors 64-1 through 64-Y respectively couple the column conductors to supply voltage $V_{cc}$.

In operation, logical "AND" terms are formed on column conductors 62-1 through 62-Y. Suppose, for example, that the signal on column conductor 62-1 is to represent the "AND" term of signals $A_1$ and $A_x$. For that to occur, the signal on column conductor 62-1 must be high whenever signal $A_1$ is high and simultaneously signal $A_x$ is low; or conversely, the signal on column conductors 62-1 must be low whenever $A_1$ is low or $A_x$ is high.

Transistor 54 in current sink 50-1 will sink current from the row conductor to which it connects when input signal $A_1$ is low; while transistor 53 in current sink 50-X will sink current from the row conductor to which it connects when input signal $A_x$ is high. Consequently, the fuse that couples column conductor 62-1 to transistor 54 in current sink 50-1 should not be blown; the fuse that couples column conductor 62-1 to transistor 53 in current sink 50-X should not be blown; and all of the remaining fuses that couple column conductor 62-1 to the row conductors should be blown.

Further included in the FIG. 2 PLA is an array 70 of transistors. This array has Y columns, Z rows, and a transistor at each row-column intersection. In FIG. 2, the column conductors are indicated by reference numerals 62-1 through 62-Y; the row conductors are indicated by reference numerals 71-1 through 71-Z; and the transistors are indicated by reference numerals 72.

Each transistor 72 has its collector connected to voltage source $V_{cc}$, has its base connected to one of the column conductors 62-1 through 62-Y, and has its emitter coupled through a fuse 73 to one of the row conductors 71-1 through 71-Z. An output circuit 80 then connects to row conductors 71-1 through 71-Z. Circuit 80 includes transistors 81-1 through 81-Z which have their collectors respectively connected to the row conductors 71-2 through 71-Z; and it includes resistors 82-1 through 82-Z which respectively connect the emitters of transistors 81-1 through 81-Z to ground.

Circuit 80 generates respective output signals on row conductors 71-1 through 71-Z which represent the logical "OR" of selected "AND" terms on column conductor 62-1 through 62-Y. Suppose, for example, that the output signal on row conductor 71-1 is to represent the "OR" of the "AND" terms on column conductor 62-1 and 62-Y. For that to occur, the voltage on row conductors 71-1 must be high whenever the voltage on column conductor 62-1 or 62-Y is high. That is achieved by not blowing the fuses 73 that couple column conductors 62-1 and 62-Y to row conductor 71-1, while simultaneously blowing the fuses 72 that couple all of the remaining column conductors to row conductor 71-1.

A mathematical analysis will now be made of the power that the FIG. 1 and FIG. 1 PLA's consume. Column 1 of FIG. 3 lists equations which analyze the FIG. 1 PLA; Column 2 lists equations which analyze the FIG. 2 PLA; and Column 3 lists equations which compare the FIG. 1 and FIG. 2 PLA's.

Equation 1 of Column 1 states that the current $I_r$ in any one of the row conductors of array 20 can under certain conditions equal the total current $I_cY$ in all of the column conductors. That condition occurs, for example, when the state of the input logic signals $A_1$–$A_x$ along with the blown—not blown state of the fuses are such that one current source supplies current to all of the column conductors while the other current sources supply no current at all.

Under such conditions, equation 2 states that the base current $I_b$ which drives the transistor 14 (or 15) in the current source that is supplying current $I_cY$ is equal to $(I_cY/\beta)$ where $\beta$ is the transistor's gain. At the same time, however, an even larger $I_{cs}$ must flow through transistor 11 to there cause a voltage drop which is large enough to turn off transistor 15. This is stated by equation 3. For example, current $I_{cs}$ may be five times as large as current $I_b$; and this is stated by equation 4.

Suppose now that the number of column conductors "Y" is 50 and beta is 50. Under such conditions, current $I_{cs}$ is five times the column conductor current $I_c$. This is stated by equation 5. And current $I_{cs}$ is made five times the magnitude of current $I_c$ by making the magnitude of resistor 18 approximately one-fifth (1/5) the magnitude of resistors 32-1 through 32-Y. This is stated by equation 6.

Resistors of the same order of magnitude in an integrated circuit are made by merely adjusting the resistors' physical dimensions while using the same steps of the IC manufacturing process. Since the same steps are used, any variation in doping concentrations, processing temperatures, etc. will be the same for all of the resistors that are formed. Thus, if the process variations are such as to cause one resistance to increase, it will also cause the other resistances to increase, and vice versa.

Resistors 18 and 32-1 through 32-Y are of the same order of magnitude; so the ratio of those resistors in any particular chip will not vary by any significant amount from their desired ratio of one-fifth. Hence, if the average value of resistors 18 and 32-1 are respectively indicated as $\hat{R}_{cs}$ and $\hat{R}$, and the actual value of those resistors in a particular chip is indicated by $R_{cs}$ and $R$, equation 7 states that $(R_{cs}/R) = (\hat{R}_{cs}/R) = 1/5$. Further, by using circuit 40 in FIG. 1, the magnitude of resistor 18 can be made nearly identical to the magnitude of resistors 32-1 through 32-Y. This is stated by equation 8.

From what is said above in equations 4 and 7, the average current $\hat{I}_{cs}$ that flows through resistor 18 can be set equal to $5\hat{I}_cY/\beta$. This is stated by equation 9. Under such conditions, a large margin of safety will exist. For example, even if the actual value of $I_c$ somehow increases by twenty percent (20%) from its average value of $\hat{I}_{cs}$, the conditions of equation 3 will still be met. This is stated by equation 10.

In view of the above, an expression for average power $\hat{P}_1$ which all of the current sources 10-1 through 10-X dissipate can now be written. That power equals current $\hat{I}_{cs}$ times the supply voltage $V_{cc}$ times the number of current sources X. This is given by equation 11.

A corresponding expression for average power dissipated in each of the current sinks 50-1 through 50-X of the FIG. 2 PLA is derived in Column 2. There, equation 1 given an expression for the current $I_{cs}$ through resistor 56 under the conditions where the current $I_c$ in all of the column conductors is being passed to a single row conductor. Under such conditions, current $I_{cs}$ equals Y times the column conductor current $I_c$ plus an additional current $I_T$ which flows through transistor 52.

Generally, the number of column conductors Y is quite large, as is stated by equation 2. So current $I_{cs}$ is generally much larger than the column conductor $I_c$; and this is stated by equation 3. Current $I_{cs}$ is inversely proportional in magnitude to the magnitude of resistor 56; whereas current $I_c$ is inversely proportional to the magnitude of resistor 64-1. Thus, resistor 56 must be substantially smaller than resistor 64-1. This is stated by equation 4.

Since resistors 56 and 64-1 through 64-Y differ substantially from each other, it is impractical to make them from the same steps of a manufacturing process by merely adjusting their physical dimensions. Instead, resistors 56 and 64-1 through 64-Y must be made by separate sets of steps; so consequently, the ratio ($R_{cs}/R$) of any two particular resistors can vary substantially from the ratio ($\hat{R}_{cs}/R$) of their average value. This is stated by equation 5.

For example, in any one particular chip, the value $R_{cs}$ of resistor 56 could be at its average value $\hat{R}_{cs}$ while at the same time the value $\hat{R}$ of resistor 64-1 through 64-Y could be at only eight-tenths (8/10) of their average value $\hat{R}$. This is stated by equation 6. Then, the value of current $I_{cs}$ would be at its average value $\hat{I}_{cs}$ while the value of the column currents $I_c$ would be twenty percent (20%) larger than their average value $\hat{I}_c$. This is stated by equation 7.

In view of the above, the average value of current $I_{cs}$ must be at least as large as $1.2\hat{I}_c Y$. This is stated by equation 8. Otherwise, the PLA would not even work since under the above conditions the current sinks 50-1 through 50-X would not be able to sink all of the column conductor current.

Recall now from equation 1 that current $I_{cs}$ is also made up of a current $I_T$ which flows through transistor 52. Current $I_T$ will be at a minimum when current $I_c Y$ is at a maximum since current $I_{cs}$ is essentially a constant. That minimal value of current $I_T$ will be approximately one-tenth (1/10) of current $I_{cs}$. This is stated by equation 9. Consequently, as stated by equation 10, current $\hat{I}_{cs}$ must be at least 1.3 times column conductor current $\hat{I}_c$ times Y.

Some margin must be provided to insure that current $I_{cs}$ is large enough to accommodate all of the current that flows to the collector of transistors 53 and 54. For example, a margin of at least ten percent (10%) should be provided. This is stated by equation 11. Thus, the average value of current $\hat{I}_{cs}$ must be made no less than 1.4 times the average value of column conductor current $\hat{I}_c$ times Y. This is stated by equation 12. Under such conditions, current sinks 50-1 through 50-X dissipate an average power $\hat{P}_2$ as given by equation 13.

Turning now to Column 3, equation 1 there gives the ratio of equation 11 in Column 1 to equation 13 in Column 2. Inspection of this power ratio shows that the current sources of FIG. 1 dissipate only approximately one-fourteenth (1/14) the power that is dissipated by the current sinks of FIG. 2.

Next, equation 2 given an expression for the average power that is dissipated in the entire PLA of FIG. 1. In that equation, the leftmost term is the average power dissipated in current sources 10-1 through 10-X; the next term is the average power dissipated in array 20; the next term is the average power dissipated in current sinks 10'-1 through 10'-Y; and the last term is the average power dissipated in array 20'.

Similarly, equation 3 given the average power that is dissipated in the entire PLA of FIG. 2. In that equation, the leftmost term is the average power dissipated by current sinks 50-1 through 50-X; the next term gives the average power dissipated in array 60; and the last term gives the average power dissipated by array 70.

Inspection of equations 2 and 3 shows that the power dissipated by arrays 20, 20', 60, and 70 is much smaller than the power dissipated by the current sources in current sinks. This is because the expressions for power dissipated in an array contain only one of the variables X, Y, or Z; whereas the expressions for power dissipated in the current sources in current sinks contain the products of those variables.

Thus, equation 2 can be simplified to include only the first and third term while equation 3 can be simplified to include only the first term. Then, to obtain the ratio of the power that is dissipated in the FIG. 1 PLA to the power that is dissipated in the FIG. 2 PLA, the above simplified equation 2 needs only to be divided by the simplified equation 3. This result is expressed as equation 4.

Inspection of equation 4 shows that the above power ratio will be less than one (1) for a wide range of the variables X, Y, and Z. For example, if the number of input signals X equals the number of output signals Z, then the FIG. 1 PLA dissipates only one-seventh (1/7) the power of the FIG. 2 PLA. This is stated in equation 5.

Next, an analysis will be made of the chip area that is required to implement the PLA's of FIG. 1 and FIG. 2. Column 1 of FIG. 4 lists equations which analyze the FIG. 1 PLA; Column 2 lists equations which analyze the FIG. 2 PLA; and Column 3 lists equations which compare the results of Columns 1 and 2.

Equation 1 of Column 1 states the number of transistors in all of the current sources 10-1 through 10-X. There are five transistors 11-15 in each of those current sources; and so the total number of transistors equals 5X. Equation 2 then states the total number of diodes in array 20 of the FIG. 1 PLA. That array has 2X rows and Y columns, and so the total number of diodes is 2XY.

Equation 3 then gives the total number of transistors in circuit 30; equation 4 gives the total number of transistors in the current sources 10'-1 through 10'-Y; equation 5 gives the total number of diodes in array 20'; and equation 6 then gives the number of transistors in output circuit 30'.

Utilizing all of the above equations 1–6, an expression can be written for the total area occupied by the FIG. 1 PLA. That expression is given as equation 7. There, a symbol $A_T$ represents the area required by a single transistor, and a symbol $A_D$ represents the area required by a single diode.

A similar analysis of the FIG. 2 PLA is given in Column 2. Equation 1 gives the total number of transistors in current sinks 50-1 through 50-X; equation 2 gives the total number of diodes in the current sinks 50-1 through 50-X; equation 3 gives the total number of diodes in array 60; equation 4 gives the total number of transistors in array 70; and equation 5 gives the total number of transistors in output circuit 80. Equations 1–5 are then combined as equation 6 to give an expression for the total area required by the FIG. 2 PLA. Symbols $A_T$ and $A_D$ again respectively represent the area occupied by one transistor and one diode.

Equation 1 in Column 3 then compares equation 7 of Column 1 with equation 6 of Column 2. Both of the terms $A_T$ and $A_D$ are included in equation 1; and area $A_T$ always is substantially greater than area $A_D$. For example, $A_T$ will be ten times $A_D$; and this is stated by equation 2. Substituting equation 2 into equation 1 then gives an expression for the ratio of the area occupied by the FIG. 1 PLA to the area occupied by the FIG. 2 PLA. This is given by equation 3.

Figure 1B:
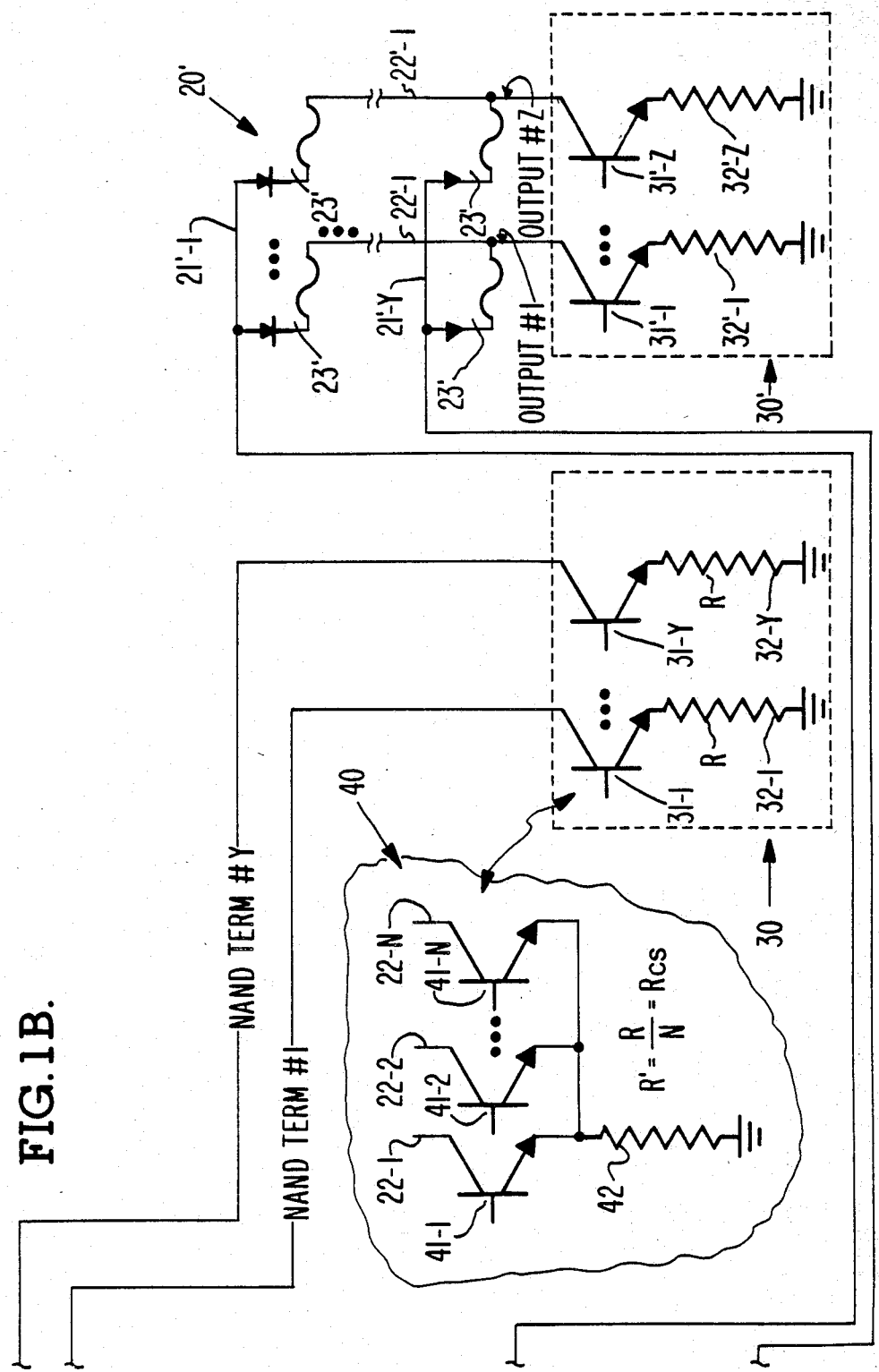
Figures 2B, 5:
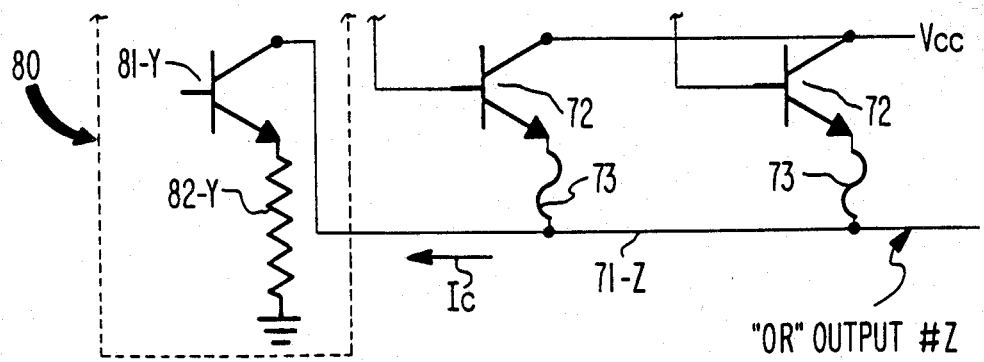

FIG. 5 contains a table which evaluates equation 3 for several ranges of the variables at X, Y, and Z. That table has three columns which from left to right respectively evaluate equation 3 under the conditions where $Z=(X/2)$, $Z=X$, and $Z=2X$. That table also has three rows which from top to bottom respectively evaluate equation 3 under the conditions where $Y=X$, $Y=2X$, and $Y=3X$.

Each row-column pair in the FIG. 5 table has two entries. The top entry gives the range for X within which equation 3 will be less than one; and the bottom entry evaluates equation 3 under the condition where X equals 30. For example, when $Z=X$ and $Y=2X$, equation 3 will be less than one for all values of X that are greater than or equal to six; and equation 3 will equal (1/2.297) when X equals 30.

That means that under the above conditions, the area occupied by the FIG. 2 PLA is 2.297 times as large as the area occupied by the FIG. 1 PLA. Generally, the number X of input signals in a PLA is at least 20, and so inspection of FIG. 5 shows that equation 3 will be less than one for all practical values of X.

Figure 6A:
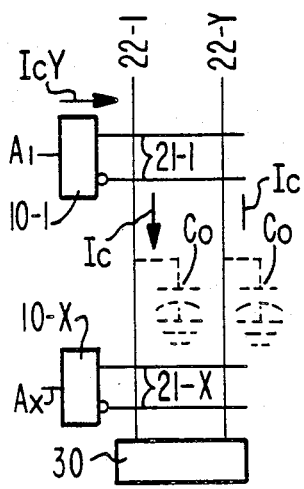
FIGS. 6A–6C show schematic diagrams of PLA's and equations which analyze the power dissipated in those PLA's.

Next, with reference to FIG. 7, still another preferred embodiment of the invention will be described. However, to understand the features of that embodiment, reference should first be made to FIGS. 6A–6C. FIG. 6A is a schematic diagram of the input signal current sources and diode array of the embodiment of FIG. 1. Reference numerals 10-1 through 10-X again indicate the current sources, reference numerals 21-1 through 21-X again indicate the row conductor pairs, and reference numerals 22-1 through 22-Y again indicate the column conductors. Equation 1 of FIG. 6A also gives an expression for the power that is dissipated in the illustrated portion of the PLA. That power was derived previously as equation 11 of Column 1 in FIG. 3.

Suppose now that the number of input signals to the PLA doubles from X to 2X. In that case, the number of current sources increases to 2X; the number of row conductor pairs increases to 2X; and the number of the column conductors stays at Y. This is illustrated in FIG. 6B wherein reference numerals 10-1 through 10-2X indicate the current sources; reference numerals 21-1 through 21-2X indicate the row conductor pairs; and reference numerals 22-1 through 22-Y indicate the column conductors.

Each of the column conductors 22-1 through 22-Y has a parasitic capacitance associated with it. This capacitance was indicated as $C_0$ in FIG. 6A. But in FIG. 6B, the length of the column conductors must double since the number of row conductor pairs doubles. Consequently, in FIG. 6B, two parasitic capacitances of $C_0$ are associated with each of the column conductors.

Figure 6B:
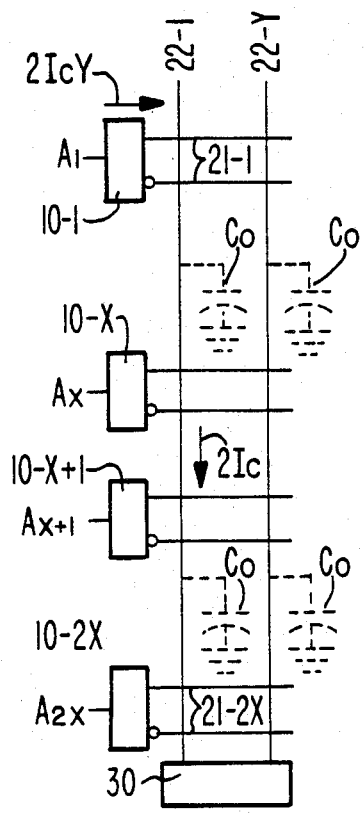

A column conductor capacitance must be discharged whenever the voltage on that conductor goes from a high to a low level; and the amount of charge Q that is required to produce a voltage change V across the capacitance is given in FIG. 6B as equation 1. That charge Q will be discharged as the current I from the column conductors to circuit 30; and its magnitude equals the magnitude of current I times the time $\Delta t$ in which current I flows. This is stated by equation 2. Utilizing equations 1 and 2, the amount of time $\Delta t$ which it takes to discharge the column conductor parasitic capacitors can be stated as equation 3.

For the FIG. 6A circuit, the value of C in equation 3 is $C_0$; whereas for the FIG. 6B circuit, the value of C is $2C_0$. This is stated by equation 4. Consequently, if the time $\Delta t$ is to be the same for both the FIG. 6A and FIG. 6B circuits, the current I which discharges the column conductor parasitic capacitances in the FIG. 6B circuit must be twice the magnitude of the corresponding current in the FIG. 6A circuit. This is stated by equation 5.

However, as current I increases, the power which the FIG. 6B circuit dissipates also increases. This is evident from equation 6 which gives the power dissipated by the FIG. 6B circuit. A comparison of equation 6 with the power dissipated by the FIG. 6A circuit shows that the FIG. 6B circuit dissipates $2^2$ times the power of the FIG. 6A circuit.

Figure 6C:
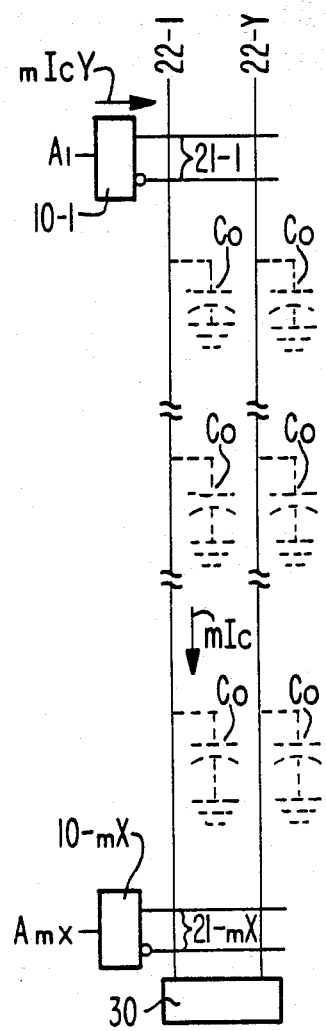

In the circuit of FIG. 6C, the number of input signals has been expanded to mX. Thus, that circuit includes mx input current sources 10-1 through 10-mX, mX row conductor pairs 21-1 through 21-mX, and Y column conductors 22-1 through 22-Y. However, the length of each of those column conductors is m times the length of the column conductors in FIG. 6A; and consequently their parasitic capacitance is m times $C_0$.

In order for the column conductor current in FIG. 6C to discharge the parasitic capacitances in the same amount of time $\Delta t$ as that taken by the FIG. 6A circuit, the column conductor current must be m times $I_c$. This is stated in FIG. 6C as equation 1. But under such conditions, the power dissipated by the FIG. 6C circuit also increases as can be seen from equation 2. A comparison of equation 2 with the power dissipated by the FIG. 6A circuit shows that the FIG. 6C circuit dissipates $m^2$ times the power of the FIG. 6A circuit.

By comparison, the embodiment of FIG. 7A dissipates substantially less power than the circuit of FIG. 6C; yet it receives the same number of input signals and operates at the same speed as the FIG. 6C circuit. Included in the FIG. 7A embodiment are a total of mX current sources 10-1 through 10-mX. Those mX current sources are partitioned into m groups with each group including a total of X current sources, and each group having its own set of column conductors.

In FIG. 7A, the first group of current sources 10-1 through 10-X has row conductors 21-11 through 21-X1 and column conductors 22-11 through 22-Y1; ...; and the last group of current sources has row conductors 21-1m through 21-Xm and column conductors 22-1m through 22-Ym. Since each of the column conductors 22-11 through 22-Ym is associated with only X row conductor pairs, its length will be the same as the length of the column conductors of FIG. 6A; so consequently it will have a parasitic capacitance of $C_0$.

Each of the m groups of column conductors respectively couples to one of the previously described circuits 30. In FIG. 7A, reference numeral 30-1 indicates the first of those circuits whereas reference numeral 30-m indicates the last of those circuits.

Corresponding column conductors in each of the m groups couple to the base of respective transistors which in turn have their emitters connected to another column conductor and their collectors connected to voltage source $V_{cc}$. For example, all of the rightmost column conductors 22-Y1 through 22-Ym couple to the base of respective transistors 90-Y1 through 90-Ym; the emitter of those transistors connect to a column conductor 91-Y; and the collector of those transistors connects to voltage source $V_{cc}$.

In operation, when current flows in any one of the column conductors 22-11 through 22-Ym, that current will charge capacitance $C_0$ which in turn will cause one of the transistors 90-11 through 90-Ym to turn on. Then, current I' will flow through one of the column conductors 91-1 through 91-Y to charge its parasitic capacitance C'.

Thus, the total time required to receive an output signal from the FIG. 7A circuit equals the time $\Delta t1$ required to discharge one capacitor $C_0$ plus the time $\Delta t2$ required to discharge one capacitor C'. This is stated in FIG. 7B as equation 1. Also, as stated previously, the time $\Delta t$ to discharge a capacitance equals $CV/I$; and substituting this relation into equation 1 yields equation 2.

Preferably, column conductors 22-11 through 22-Ym are made of patterned diffusions in a semiconductor substrate; row conductors 21-11 through 21-mX are made of patterned metal lines which lie on an insulating layer over the substrate; and the interconnecting diodes 23 (not shown) are Schottky diodes that are formed by contacts between the patterned metal lines and patterned diffusions. Also preferably, column conductors 91-1 through 91-Y are made of a patterned second level metal layer which lies on an insulating layer over the patterned metal layer that forms the row conductors.

In that case, capacitance $C_0$ can be broken into the floor capacitance of the diffusion plus two times the sidewall capacitance of the diffusion. This is stated by equation 3. Those capacitances will vary from process to process; but a typical floor capacitance of a diffusion is 0.10 fF/□ and a typical sidewall capacitance for diffusion is 0.40 fF/□. This is stated by equation 4. Also, the parasitic capacitance of a patterned metal layer will vary from process to process; but a typical value for such parasitic capacitance is 0.025 fF/□. This is stated by equation 5.

In other words, a typical capacitance ratio of a diffusion capacitor to a metal on an insulating layer capacitor is approximately 30:1. This is stated by equation 6. Consequently, in equation 2, capacitor C' is approximately one-thirtieth (1/30) capacitor $C_0$. So if the current I' that discharges capacitor C' is made equal to the current $I_0$ that discharges capacitor $C_0$, then the total charge time for the FIG. 7A embodiment will approximately equal $\Delta t_1$. This is stated by equation 7.

Next, equation 8 gives an expression for the power dissipated by each group of X current sources in the FIG. 7A circuit. There, symbol P1 represents the power dissipated by the first group of current sources; symbol P2 represents the power dissipated by the second group of current sources, etc.; and that power was previously derived as $P_o$ in equation 11 of Column 1 of FIG. 3. Thus, equation 9 states that the total power dissipated by all of the FIG. 7A current sources is $mP_o$.

Next, equation 10 gives an expression for the power dissipated by the column conductor circuitry in FIG. 7A. In that equation, the rightmost term is the power dissipated by that circuitry which carries current I'; and the next term is the power dissipated by that circuitry which carries current $I_c$. Inspection of equation 10 shows that both of those terms are insignificant to $mP_o$ when current I' equals current $I_c$ and the number of input terms mX is much larger than one. Also, the power expressed by the second term is identical to the power dissipated in the array of FIG. 6C, so that term will cancel out in a comparison of the two PLA's.

Equation 10 can thus be ignored in the expression for the total power dissipated for the FIG. 7A circuit. And that leaves out equation 9. Then, equation 9 can be compared with equation 3 of FIG. 6C; and that gives equation 11. This result shows that the power dissipated by the FIG. 7A circuit is only (1/m) times the power dissipated by the FIG. 6C circuit, which is a substantial improvement for large values of m.

Various preferred embodiments of the invention have now been described in detail. In addition, however, many changes and modifications can be made to these details without departing from the nature and spirit of the invention. Therefore, is to be understood that the invention is not limited to said details but is defined by the appended claims.

What is claimed is:

1. A logic array including a plurality of gated current source means for receiving respective input signals, each of said gated current source means being coupled to a respective row conductor and including means for sending current to said respective row conductor when the received input signal is in a predetermined state; said respective row conductors being partitioned into m groups where m is an integer greater than one; a respective high capacitance column conductor for each group of row conductors; respective coupling means connected between each group of row conductors and its high capacitance column conductor for selectively coupling current from the row conductors of each group to the high capacitance column conductor of the same group; a low capacitance column conductor; and m circuit means each of which is connected between a respective high capacitance column conductor and said low capacitance column conductor for generating current on said low capacitance column conductor whenever current from any of said row conductors is coupled by any of said coupling means to their corresponding high capacitance column conductor, and for isolating the respective capacitance of said high capacitance column conductors from each other.

2. A logic array according to claim 1 wherein the total capacitance on said low capacitance column conductor when coupled through said m circuit means to said high capacitance column conductors is less than half the capacitance of a single high capacitance column conductor.

3. A logic array according to claim 1 wherein said respective high capacitance column conductors are comprised of patterened diffusion regions in a semiconductor substrate, and said low capacitance column conductor is comprised of a patterned metal layer insulatedly lying on the surface of said substrate; the patterning of said diffusion regions being predetermined and independent of said respective coupling means.

4. A logic array according to claim 1 wherein said current in each respective high capacitance column conductor is of the same order of magnitude as said current in said low capacitance column conductor.

5. A logic array according to claim 1 wherein each of said m circuit means includes a transistor means having an input terminal coupled to a respective high capacitance column conductor and an output terminal coupled to said low capacitance column conductor.

6. A logic array according to claim 1 wherein said means for selectively coupling current include diodes which couple current from said row conductors to said respective high capacitance column conductors.

7. A logic array including a plurality of row conductors; means for sending current to said row conductors; said row conductors being partitioned into several groups; a respective high capacitance column conductor for each group of row conductors; means for selectively coupling current from said row conductors to said column conductor of the respective groups; a low capacitance column conductor; and means coupled between said high capacitance column conductors and said low capacitance column conductor for generating current on said low capacitance column conductor whenever current flows from a row conductor in at least one of said groups through said means for selectively coupling to the respective high capacitance column conductor for that group, and for isolating the respective capacitances of said high capacitance column conductors from each other.

8. A logic array according to claim 7 wherein said means for selectively coupling current includes diodes which couple current from said row conductors to said respective column conductors.

9. A logic array according to claim 7 wherein said means for selectively coupling current includes fuses which couple current from said row conductors to said respective column conductors.

10. A logic array according to claim 7 wherein the total capacitance on said low capacitance column conductor when coupled to said high capacitance column conductors through said means for generating and for isolating is less than half the capacitance of a single one of said high capacitance column conductors.

11. A logic array according to claim 7 wherein said low capacitance column conductor is comprised of a patterned metal layer insulatedly lying on the surface of a semiconductor substrate and said respective column conductors are comprised of patterned diffusion regions in said substrate; the patterning of said diffusion regions being independent of said means for selectively coupling.

12. A logic array according to claim 7 wherein said means for generating and for isolating includes a transistor means having respective bases coupled to each high capacitance column conductor and having output terminals coupled to said low capacitance column conductor.

* * * * *